United States Patent
Kitajima et al.

(10) Patent No.: US 7,794,234 B2
(45) Date of Patent: Sep. 14, 2010

(54) ELECTRICAL CONNECTOR HAVING A CONNECT PORTION CONNECTING TWO CONTACT PORTIONS HAVING PROJECTIONS AND A DRAINAGE AT LEAST PARTIALLY BETWEEN THE PROJECTIONS

(75) Inventors: Naoya Kitajima, Tokyo (JP); Seiya Takahashi, Tokyo (JP); Katsumi Arai, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 12/315,305

(22) Filed: Dec. 2, 2008

(65) Prior Publication Data

US 2009/0156020 A1 Jun. 18, 2009

(30) Foreign Application Priority Data

Dec. 12, 2007 (JP) .............................. 2007-321339

(51) Int. Cl.
   *H01R 12/00* (2006.01)
(52) U.S. Cl. ....................................................... 439/66
(58) Field of Classification Search ................... 439/66, 439/67, 71, 91, 86; 205/104
   See application file for complete search history.

(56) References Cited

U.S. PATENT DOCUMENTS

| 4,547,834 | A | * | 10/1985 | Dumont et al. ............... 439/66 |
| 5,273,439 | A | * | 12/1993 | Szerlip et al. ................. 439/66 |
| 5,702,269 | A | * | 12/1997 | Uchida et al. ................. 439/67 |
| 5,876,580 | A | * | 3/1999 | Lykins, II ..................... 205/104 |
| 6,241,533 | B1 | * | 6/2001 | Matsumoto ................... 439/67 |
| 6,336,816 | B1 | * | 1/2002 | Yatskov et al. ................ 439/67 |
| 6,403,226 | B1 | * | 6/2002 | Biernath et al. .............. 428/447 |
| 6,450,821 | B2 | | 9/2002 | Otsuki et al. |
| 6,869,291 | B2 | * | 3/2005 | Norland et al. ............... 439/67 |
| 7,252,512 | B2 | * | 8/2007 | Tai et al. ....................... 439/39 |
| 7,303,403 | B2 | | 12/2007 | Kuwahara |
| 2001/0041465 | A1 | * | 11/2001 | Szalay et al. .................. 439/67 |
| 2002/0173175 | A1 | * | 11/2002 | Brodsky et al. ............... 439/66 |
| 2008/0057757 | A1 | * | 3/2008 | Arai et al. ...................... 439/86 |
| 2008/0268668 | A1 | * | 10/2008 | Arai et al. ...................... 439/66 |

FOREIGN PATENT DOCUMENTS

| JP | 02-032670 | 2/1990 |
| JP | 8-203583 | 8/1996 |
| JP | 2001-257047 | 9/2001 |
| JP | 2001-266990 | 9/2001 |
| JP | 2004-111081 | 4/2004 |
| JP | 2006-310140 | 11/2006 |

OTHER PUBLICATIONS

Japanese Office Action dated Sep. 17, 2009 with English translation of same.

\* cited by examiner

*Primary Examiner*—Chandrika Prasad
(74) *Attorney, Agent, or Firm*—Collard & Roe, P.C.

(57) ABSTRACT

The present invention provides a connector configured to electrically connect two connection objects. The connector comprises an elastic member having a surface and a conductive film placed on the surface of the elastic member. The conductive film comprises two contact portions to be brought into contact with the connection objects, respectively, and a connect portion connecting the contact portions. Each of the contact portions comprises projections and a drainage arranged, at least in part, between the projections.

10 Claims, 14 Drawing Sheets

····· ① COMPARATIVE EXAMPLE WITHOUT GREASE
—— ② COMPARATIVE EXAMPLE WITH GREASE
—— ③ PRESENT EMBODIMENT WITHOUT GREASE
– – ④ PRESENT EMBODIMENT WITH GREASE

ELECTRICAL CONNECTOR HAVING A CONNECT PORTION CONNECTING TWO CONTACT PORTIONS HAVING PROJECTIONS AND A DRAINAGE AT LEAST PARTIALLY BETWEEN THE PROJECTIONS

CROSS REFERENCE TO RELATED APPLICATION

Applicants claim priority under 35 U.S.C. §119 of Japanese Application No. 2007-321339 filed Dec. 12, 2007.

BACKGROUND OF THE INVENTION

This invention relates to an electrical connector for electrically connecting two connection objects, wherein "electrical connector" is simply referred to as "connector" hereinafter.

JP-A 2006-310140 discloses a connector which comprises an elastic member having a surface and a conductive film placed on the surface, disclosure of JP-A 2006-310140 being incorporated herein by reference in its entirety. This structure allows that low contact-pressure can maintain electrical connections between the connector and the connection objects without soldering. However, the disclosed connector has a problem that, if a contact portion of the connection object is contaminated by oil, grease or other fluid material, the contaminated contact portion may have a large resistance.

JP-A 2001-257047 or JP-A 2001-266990 disclose a connector different in type from the connector disclosed in JP-A 2006-310140, disclosure of JP-A 2001-257047 and JP-A 2001-266990 being incorporated herein by reference in their entirety. The connector comprises contact portions each having a plurality of projections. The projections clean up solder balls of a connection object when the contact portions of the connector come into contact with the solder balls of the connection object. However, the projections are required to resist abrasion.

SUMMARY OF THE INVENTION

It is an object of the present invention to provide a connector that has a simple structure and solves the problem mentioned above.

One aspect of the present invention provides a connector configured to electrically connect two connection objects. The connector comprises an elastic member having a surface and a conductive film placed on the surface of the elastic member. The conductive film comprises two contact portions to be brought into contact with the connection objects, respectively, and a connect portion connecting the contact portions. Each of the contact portions comprises projections and a drainage arranged, at least in part, between the projections.

An appreciation of the objectives of the present invention and a more complete understanding of its structure may be had by studying the following description of the preferred embodiment and by referring to the accompanying drawings.

Figure 1:
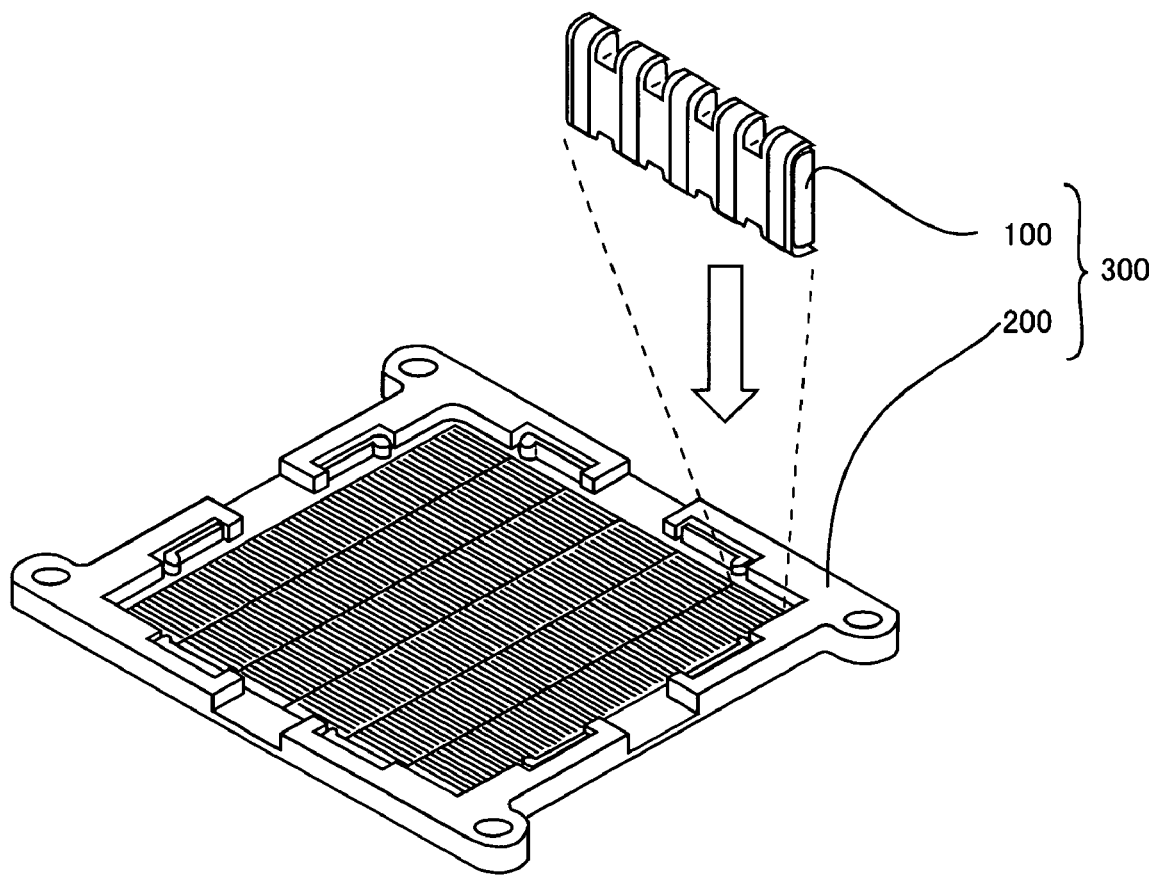
FIG. 1 is a perspective view schematically showing a connector apparatus according to a first embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF THE PREFERRED EMBODIMENTS

First Embodiment

With reference to FIG. 1, a connector apparatus 300 according to a first embodiment of the present invention is configured to electrically connect two connection objects (not shown). The connector apparatus 300 of the first embodiment comprises an insulation frame 200 and a plurality of connectors 100 arranged in the insulation frame 200. The connector apparatus 300 of the present embodiment is connectable to a land grid array (LGA) package. Another connector apparatus according to the present embodiment may be connected to other electronic package.

Figure 2:
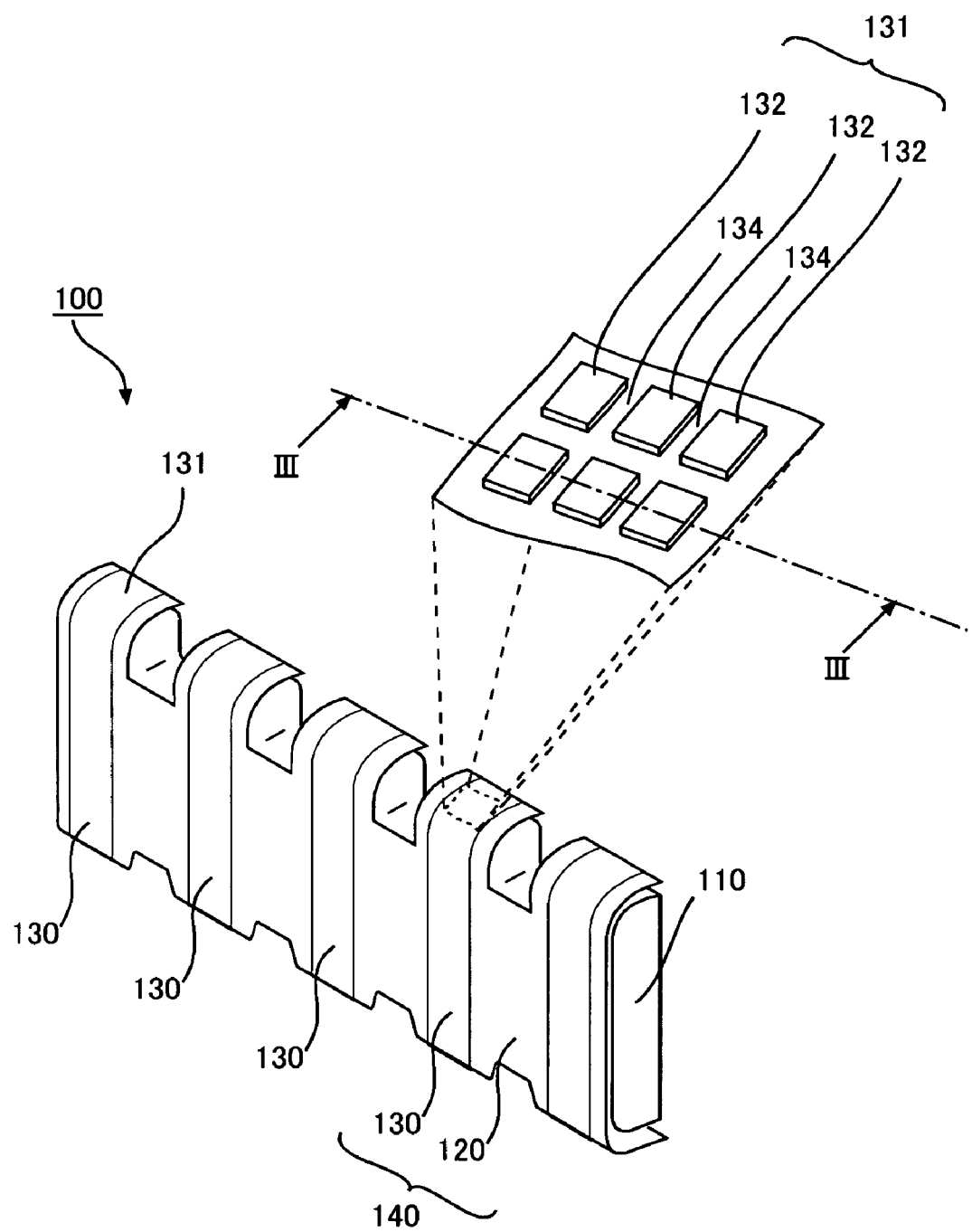
FIG. 2 is a perspective view schematically showing a connector included in the connector apparatus of FIG. 1.

With reference to FIG. 2, each connector 100 of the present embodiment comprises an elastic block 110 and a conductive film 140. The elastic block 110 has a surface, and the conductive film 140 is glued on the surface with a glue. The conductive film 140 comprises an insulation film 120 and conductive patterns 130 formed on the insulation film 120. Each conductive pattern 130 generally has a strip shape. The conductive film 140 has an upper portion and a lower portion. The conductive film 140 comprises a plurality of contact portions (upper contact portions) 131 positioned on the upper portion, a plurality of contact portions (lower contact portions) 131 positioned on the lower portion and connect portions connecting the respective upper contact portions 131 and the respective lower contact portions 131. Each contact portion 131 can be brought into contact with a corresponding contact (pad) of the connection object, for example, a land of an LGA package, a pad on a substrate, or the like. The number of the upper contact portions 131, accordingly, the number of the lower contact portions 131, too, should be equal to or more than the number of the contacts of the connection object.

Figure 3:
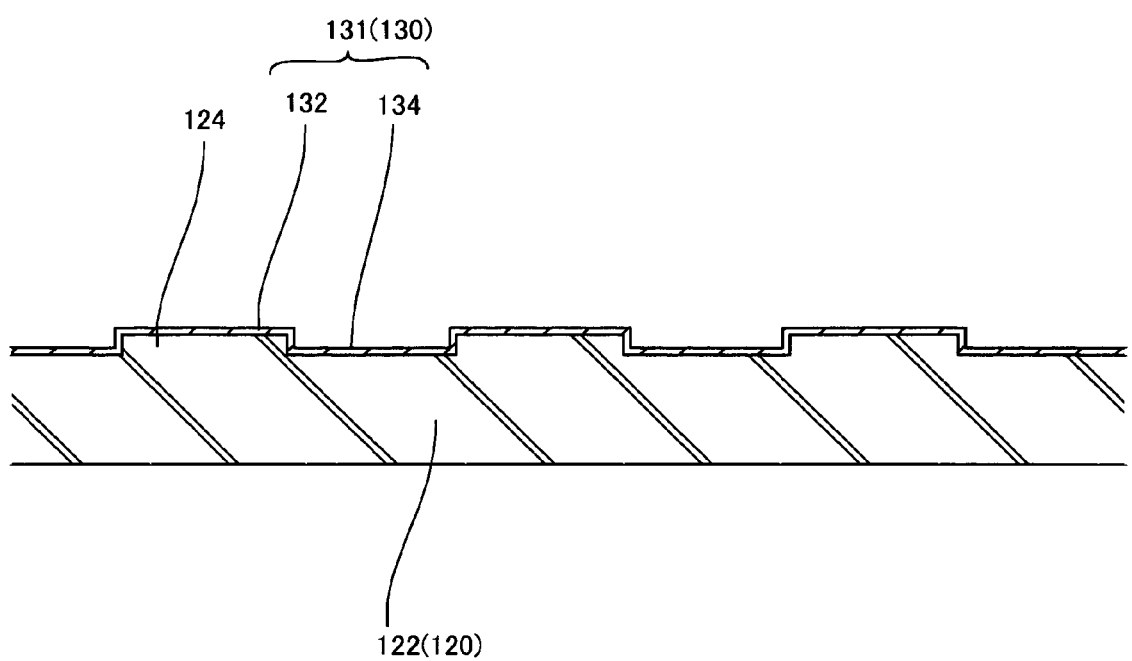
FIG. 3 is a partial, cross-sectional view schematically showing a conductive film included in the connector of FIG. 2, taken along lines III-III.

With reference to FIGS. 2 and 3, each contact portion 131 comprises projections 132 and drainages 134 arranged between the projections 132. In detail, the insulation film 120 has a plurality of predetermined areas 122 corresponding to the contact portions 131, respectively. Each predetermined area 122 is provided with base projections 124. The base projections 124 correspond to the projections 132, respectively. The conductive pattern 130 has contact areas positioned on the predetermined areas 122, respectively. The contact areas of the conductive pattern 130 and the predetermined areas 122 of the insulation film 120 constitute the contact portions 131. Each projection 132 of this embodiment has a rectangular block shape.

The base projections 124 of the insulation film 120 may be formed through an etching process, a laser process, a blasting process or a matting process. The etching process comprises: forming on a base material of the insulation film 120 a resist member for example, a resist film, a resist coating or the like; patterning the resist member; etching the base material with acid or alkali solutions by using the patterned resist member as a mask; and removing the resist member. Other etching techniques, such as an ion etching, may be used. The laser process comprises: directly forming the base projections 124 on a base material of the insulation film 120 by the use of a laser device; or forming a patterned mask on base material of the insulation film 120 and exposing the base material to beams of a laser-device to form the base projections 124. The blasting process comprises: forming a resist member on a base material of the insulation film 120; patterning the resist member; blasting abrasive agents to the base material by the use of the patterned resist member as a mask to form the base projections 124; and removing the patterned resist member. The matting process comprises, in addition to the steps of the etching process or the blasting process, matting a surface of the processed base material.

The drainage 134 allows that, even if the contact portion 131 is contaminated by grease or the like, the grease or the like is pushed into the drainage 134 when the connector 100 is connected to the connection object. In addition, since the drainages 134 of the embodiment are formed across the contact portion 131, the grease or the like can be pushed out to the outside of the contact portion 131 through the drainage 134 even when the grease or the like has a large amount.

Figure 4:
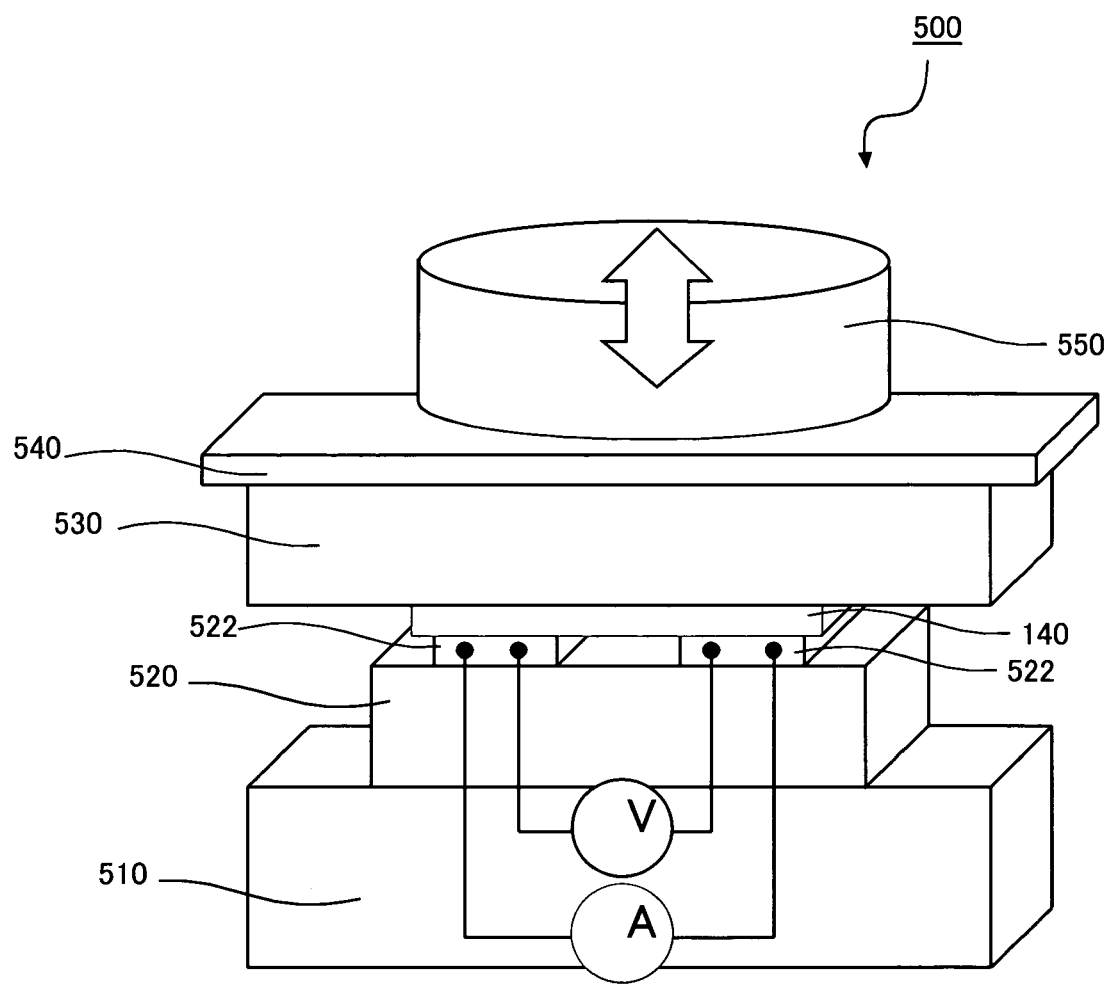
FIG. 4 is a view schematically showing an evaluator for use in evaluating a sample of the connector of FIG. 2.

Analyses have been made about the above-mentioned connector 100 for the purpose of evaluating connection capabilities of the connectors. A sample of the conductive film 140 was formed and was evaluated by an evaluator 500 as shown in FIG. 4. The evaluator 500 comprises an XY-stage 510, an FRP (Fiber Reinforced Plastics) substrate 520 arranged on the XY-stage 510, a rubber sheet 530, a transparency film (or board) 540 arranged on the rubber sheet 530, and a columnar probe 550 for pushing the rubber sheet 530 through the transparency film 540. The FRP substrate 520 is provided with Cu electrode pads 522.

The sample of the conductive film 140 was made as follows. An aramid system film having a thickness of 4 micro meters was used as a base film. The base film is processed so that the insulation film 120 with the base projections 124 is obtained. A conductive pattern 130 was formed on the insulation film 120 so that the projections 132 and the drainages 134 were formed. The conductive pattern 130 was made of Au (0.3 micro meters), Ni (0.5 micro meters) and Cu (3 micro meters). Each of the projections 132 has a rectangular block shape having 30 micro meters square by 3 micro meters high and was arranged on the contact portion 131 at 60 micro meters intervals. A comparative example was also prepared by forming a conductive pattern on an insulation film with no base projection. The sample of the conductive film 140 is positioned between the Cu electrode pads 522 and the rubber sheet 530 with the contact potions 131 brought into contact with the Cu electrode pads 522, respectively. A measurement has been carried out for a resistance of the contact portion 131 in a state where the conductive film 140 is pushed by the columnar probe 550. Analyses were made for a case where grease is applied to the conductive films 140 and for another case without grease. A thickness of the grease coating the Cu electrode pads was about 0.01 millimeter. The measurement has also been carried out for the comparative example.

Figure 5:
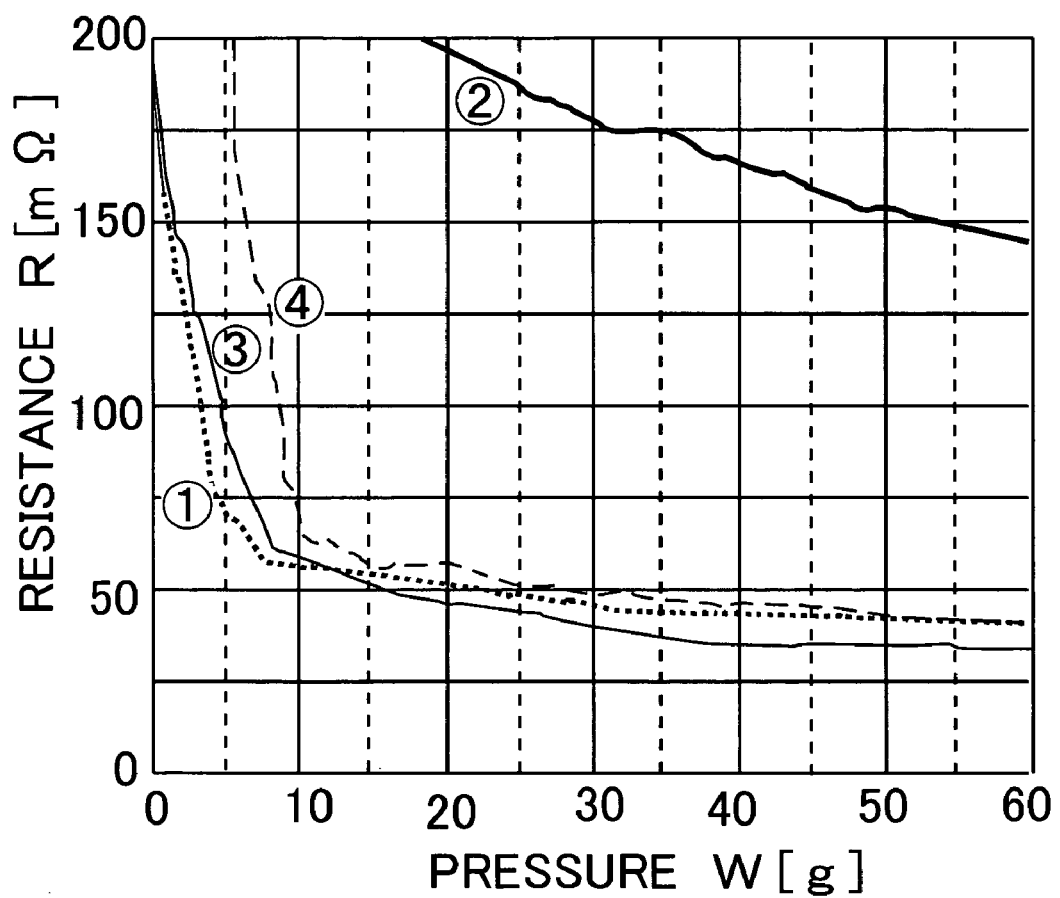
FIG. 5 is a graph showing evaluation results obtained by the evaluator of FIG. 4.

It is clear from FIG. 5 that the comparative example with grease has a large resistance. On the other hand, because of the drainages 134, the sample of the present embodiment with grease has a resistance that is almost same as the sample of the present embodiment without grease.

Figure 6:
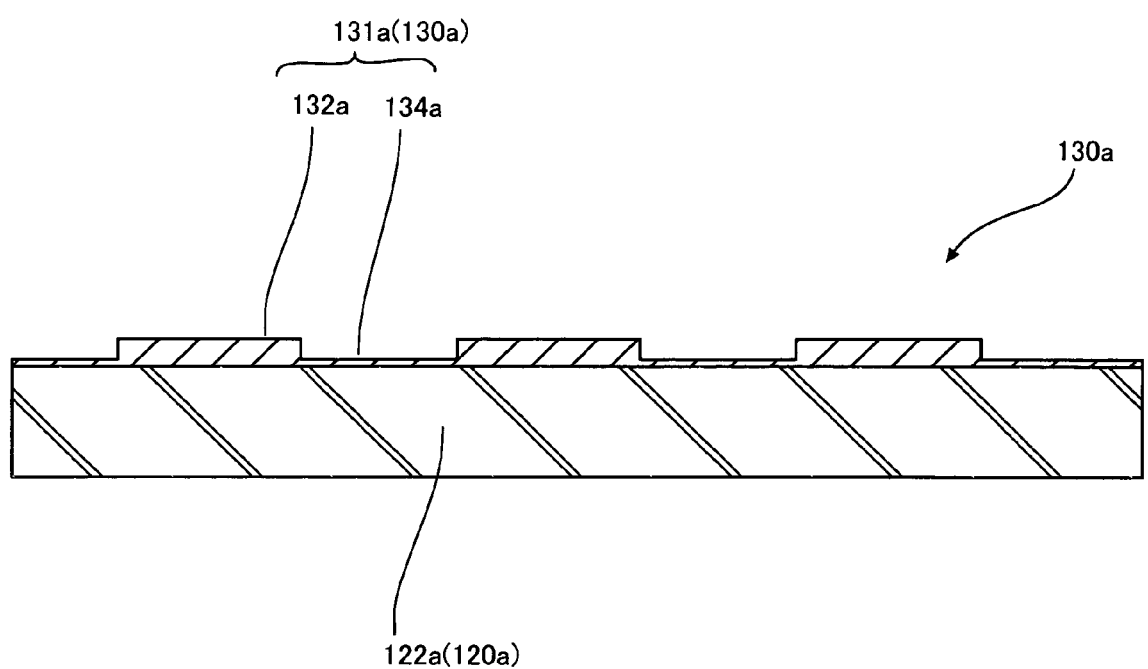
FIG. 6 is a partial, cross-sectional view schematically showing a modification of the conductive film of FIG. 3.

Although the above-described projections 132 of each contact portion 131 are constituted by the base projection 124 of the insulation film 120 and the conductive pattern 130 formed on the base projection 124, the present invention is not limited thereto. For example, as shown in FIG. 6, each contact portion 131a may be constituted by forming, on a flat area 122a of an insulation film 120a, a conductive pattern 130a with projections 132a and drainages 134a.

The projections 132a and the drainage 134a of the conductive pattern 130a may be obtained by forming an original pattern having predetermined areas corresponding to the contact portions 131a, respectively, followed by exposing the predetermined areas of the original pattern to an etching process, a laser process, a blasting process or a matting process, wherein the original pattern is for example a conductive film disclosed in JP-A 2006-310140 and has a predetermined thickness. The etching process comprises: forming on the original pattern a resist member such as a resist film or a resist coating; patterning the resist member; etching the original pattern with acid or alkali solutions by using the patterned resist member as a mask; and removing the resist member. Other etching techniques, such as an ion etching, may be used. The laser process comprises: directly forming the projections 132a on the original pattern by the use of a laser device; or forming a patterned mask on the original pattern and exposing the original pattern to beams of a laser-device to form the projections 132a. The blasting process comprises: forming a resist member on the original pattern; patterning the resist member; blasting abrasive agents to the original pattern by the use of the patterned resist member as a mask to form the projections 132a; and removing the patterned resist member. The matting process comprises, in addition to the steps of the etching process or the blasting process, matting a surface of the processed original pattern. In this embodiment, another conductive material such as a gold plated film may be further laminated on the original pattern processed by the etching process, the laser process or the blasting process.

Figure 7:
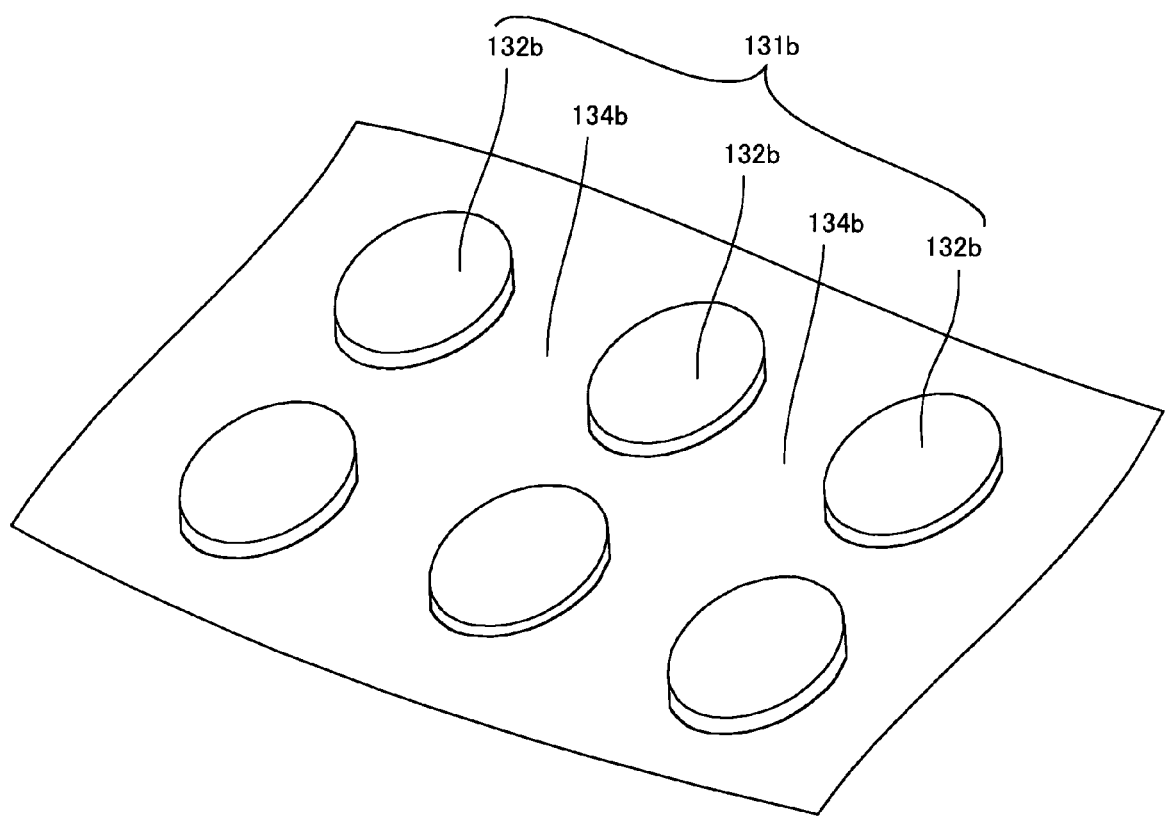
FIG. 7 is a partial, perspective view schematically showing another modification of the conductive film of FIG. 3.
Figure 8:
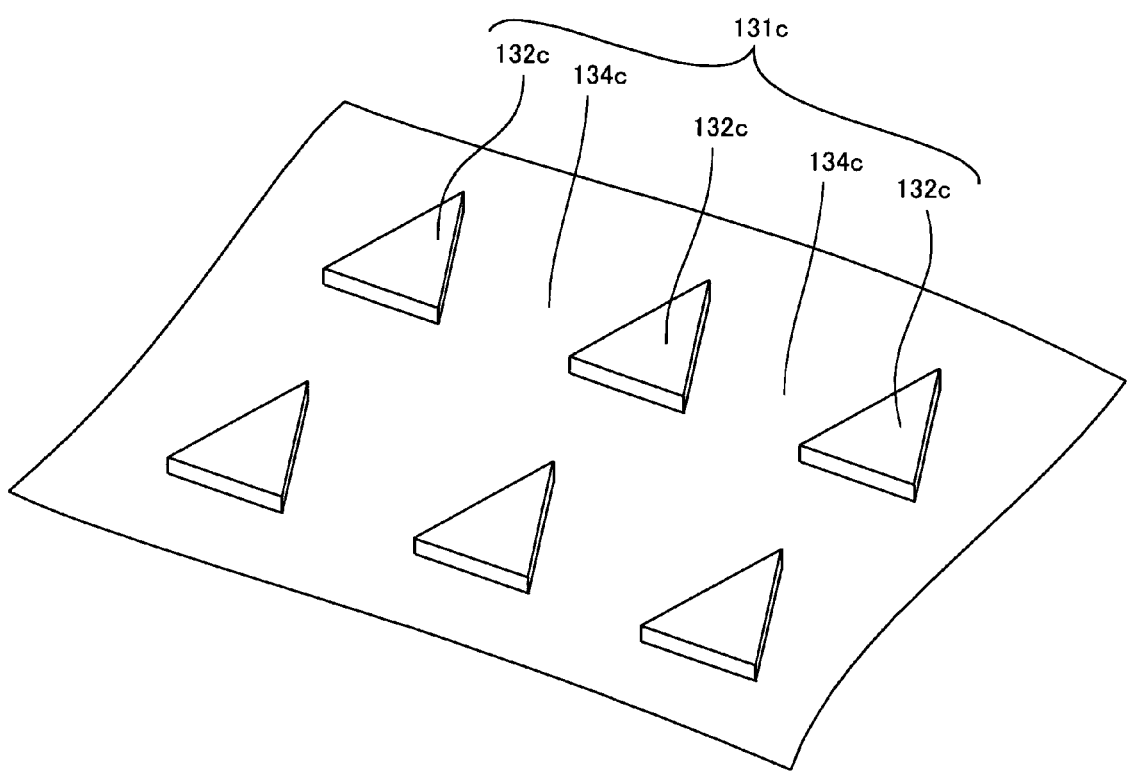
FIG. 8 is a partial, perspective view schematically showing another modification of the conductive film of FIG. 3.
Figure 9:
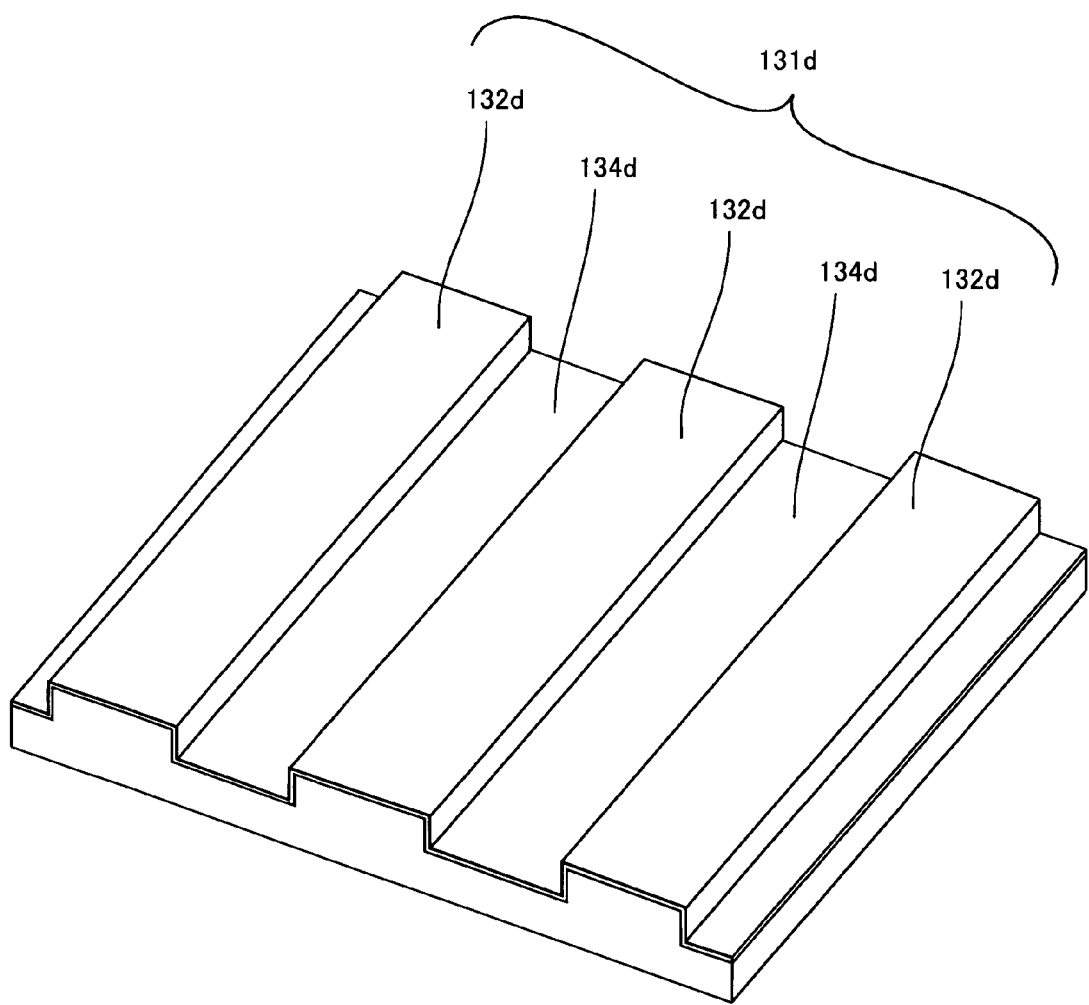
FIG. 9 is a partial, perspective view schematically showing another modification of the conductive film of FIG. 3.

Each of the projections 132 of the contact portion 131 has a rectangular block shape. Other shapes of the projections can be adapted as long as the drainage 134 can be arranged between the projections 132. For example, as shown in FIG. 7, projections 132b may have a cylindrical shape, and drainages 134b may be formed between the projections 132b. With reference to FIG. 8, projections 132c may have a triangular prism shape, and drainages 134c may be formed between the projections 132c. Moreover, as shown in FIG. 9, projections 132d may be arranged in a striped form, and drainages 134d may be formed between the projections 132d. The above-described projections 132b, 132c or 132d shown in FIG. 7, 8 or 9 may be formed on a flat plane insulation film.

Second Embodiment

Figure 10:
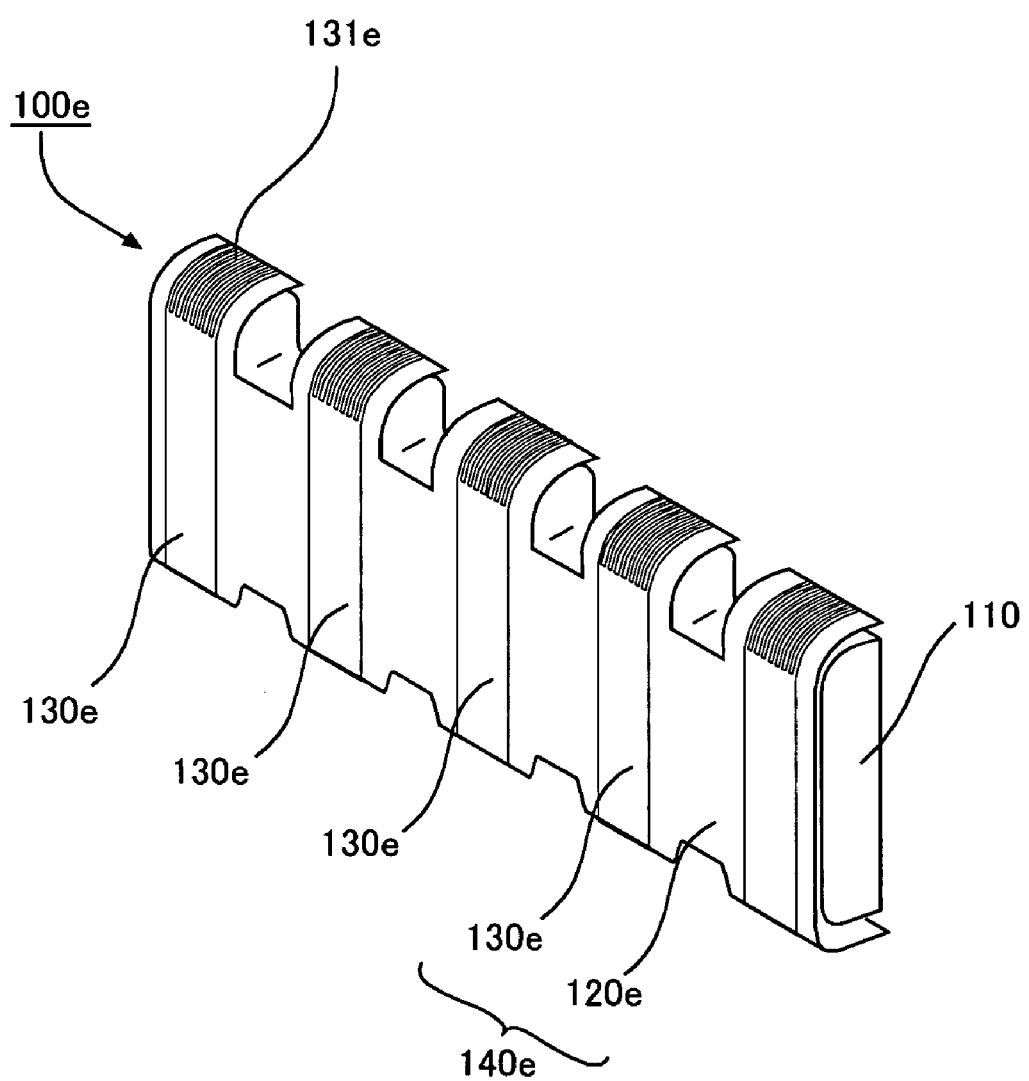
FIG. 10 is a perspective view schematically showing a connector according to a second embodiment of the present invention.

With reference to FIG. 10, a connector 100e according to a second embodiment is similar to that of the first embodiment. In FIG. 10, the same reference numbers are given to the components same as those illustrated in FIG. 2, and the description therefor will be omitted.

Figure 11:
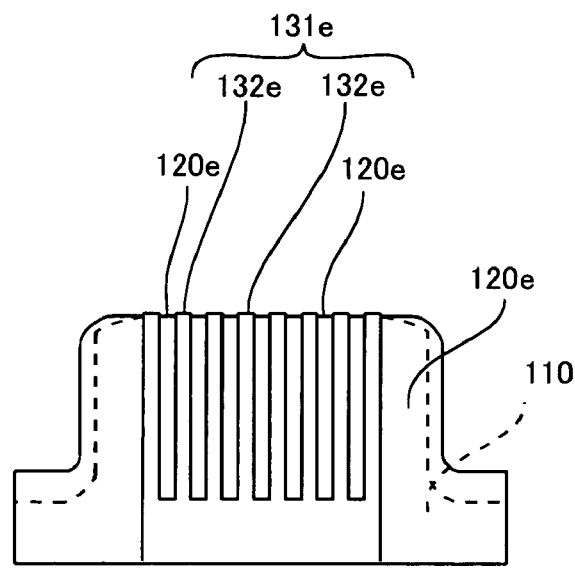
FIG. 11 is a front view schematically showing a contact portion of a conductive film included in the connector of FIG. 10.

The connector 100e comprises a conductive film 140e. The conductive film 140e of the second embodiment comprises an insulation film 120e and a conductive pattern 130e formed on the insulation film 120e. The conductive pattern 130e has two predetermined areas corresponding to the contact portions 131e, respectively, and is provided with thin lines. The thin lines are formed on the predetermined areas. Neighboring thin lines in each predetermined area are separated from each other by an interval. As shown in FIG. 11, the thin lines serve as the projections 132e, and the intervals between the thin lines serve as the drainages.

Figure 12:
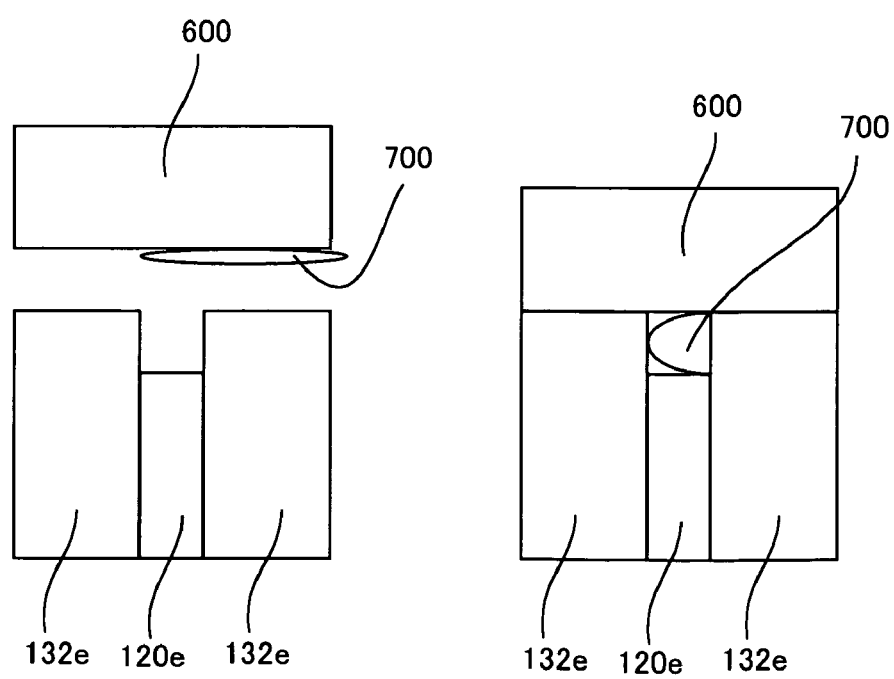
FIG. 12 is a partial, enlarged view schematically showing the contact portion of FIG. 11.

Even if a contaminant 700 such as grease is placed on the pad 600 of the connection object, as shown in the left figure of FIG. 12, the contaminant 700 can be pushed out in the drainages when the contact portion 131e of the connector 100e and the pad 600 of the connection object are brought into contact. The contact portion 131e and the pad 600 can be electrically connected, as shown in the right figure of FIG. 12.

Figure 13:
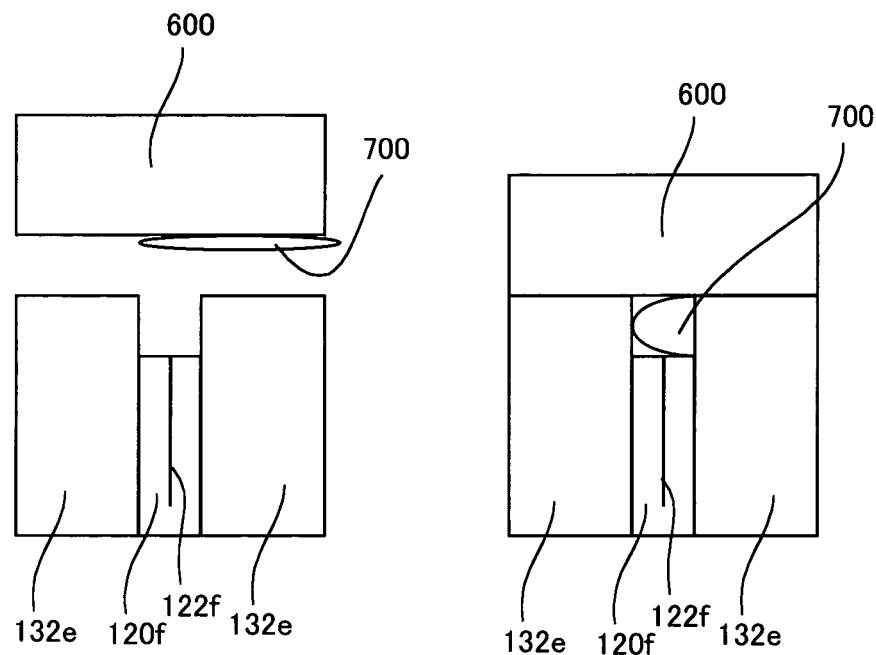
FIG. 13 is a partial, enlarged view schematically showing a modification of the contact portion of FIG. 12.
Figure 14:
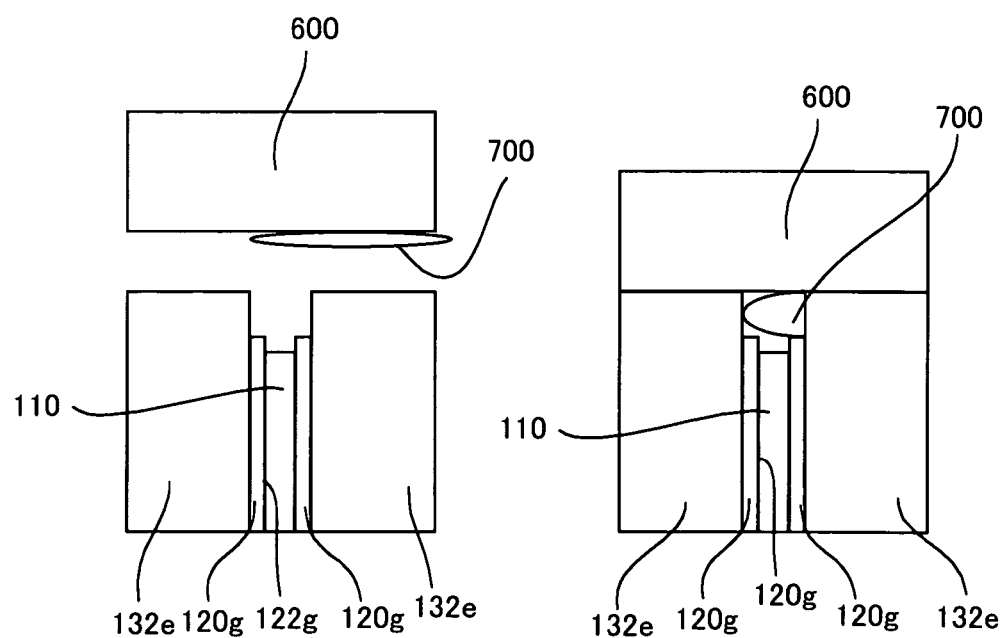
FIG. 14 is a partial, enlarged view schematically showing a modification of the contact portion of FIG. 12.

The insulation film 120e may have other structural forms. For example, as shown in FIG. 13, an insulation film 120f may be provided with cuts 122f. The cuts 122f are formed at positions corresponding to the intervals (between the thin lines 132e). Because each cut 122f can open, each of the thin lines 132e can be displaced in a lateral direction. The lateral displacement of the thin lines 132e results in wiping the contaminant 700 off the pad 600 of the connection object. Likewise, as shown in FIG. 14, an insulation film 120g may be provided with slits 122g. The slits 122g are formed at positions corresponding to the intervals (between the thin lines 132e). As shown in FIG. 14, the elastic block 110 is exposed. Because each slit 122g can be widened, each of the thin lines 132e can be displaced in a lateral direction. The lateral displacement can also provide a wipe function wiping the pad 600 of the connection object.

Figure 15:
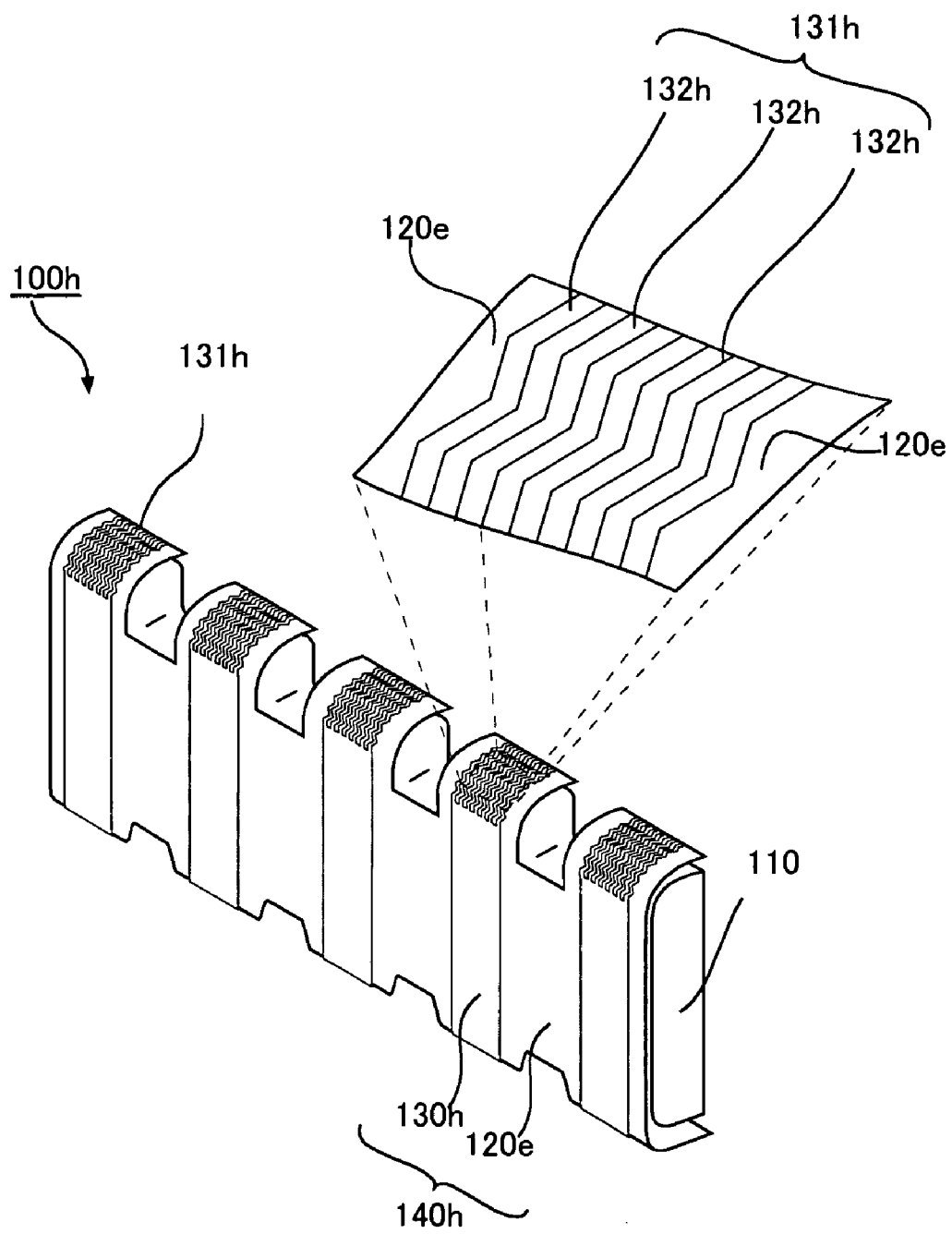
FIG. 15 is a perspective view schematically showing a modification of the connector of FIG. 10.
Figure 16:
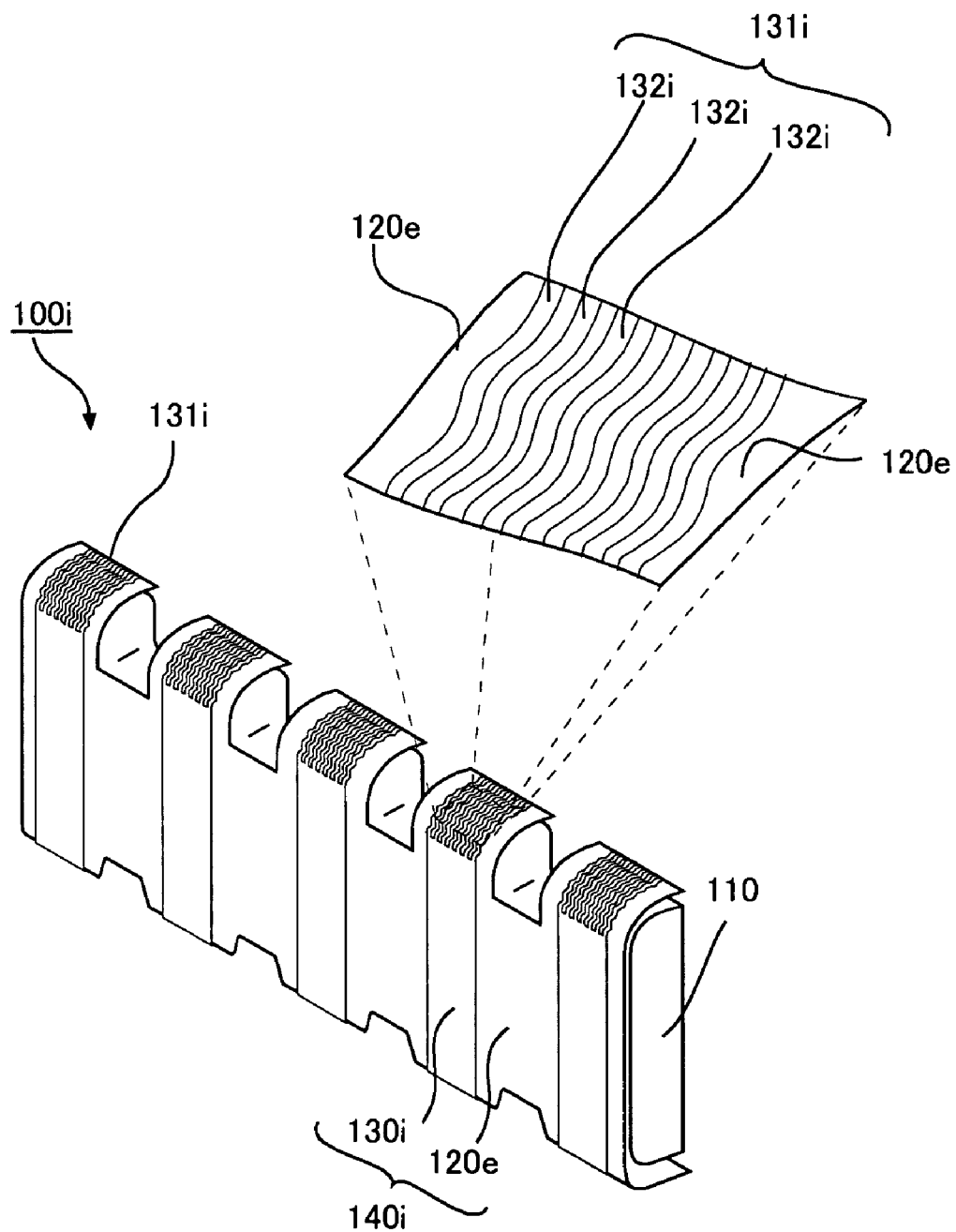
FIG. 16 is a perspective view schematically showing a modification of the connector of FIG. 10.

As shown in FIG. 15, each of thin lines 132h may be a zigzag shape. The thin lines 132h are tolerant of a stress given by the connection between the connection object and a connector 100h. Likewise, as shown in FIG. 16, each of thin lines 132i may be a curved line. The thin lines 132i are also tolerant of a stress given by the connection between connection object and a connector 100i. Although each of the thin lines 132i of FIG. 16 is a wavy line having a plurality of curves, the thin line 132i may have a single curve. Cuts or slits as shown in FIG. 13 or 14 may be formed on the insulation film 120e.

The connector of the present invention may have a combined feature described in the first and the second embodiments and the variations thereof. For example, a part of the drainage described in the first embodiment may be removed so that the insulation film is partially exposed. In addition, cuts or slits may be formed on the exposed portion of the insulation film.

The present application is based on a Japanese patent application of JP 2007-321339 filed before the Japan Patent Office on Dec. 12, 2007, the contents of which are incorporated herein by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A connector configured to electrically connect an upper connection object and a lower connection object, the upper connection object having a plurality of contacts, the lower connection object having a plurality of contacts, the connector comprising an elastic member having a surface and a conductive film placed on the surface of the elastic member, the conductive film comprising a plurality of upper contact portions, a plurality of lower contact portions and connect portions connecting the respective upper contact portions and the respective lower contact portions, each of the upper contact portions being arranged to be brought into contact with a corresponding one of the contacts of the upper connection object, each of the lower contact portions being arranged to be brought into contact with a corresponding one of the contacts of the lower connection object, each of the upper contact portions comprising projections and a drainage arranged, at least in part, between the projections, each of the lower contact portions comprising projections and a drainage arranged, at least in part, between the projections, wherein the conductive film comprises an insulation film and conductive patterns formed on the insulation film, the insulation film having a plurality of predetermined areas corresponding to the upper contact portions and the lower contact portions, respectively, the insulation film being provided with base projections formed on each of the predetermined areas, the base projections corresponding to the projections of the upper contact portions and the lower contact portions, each of the conductive patterns having two contact areas positioned on the predetermined areas, one of the contact areas of the conductive pattern and one of the predetermined areas of the insulation film constituting the upper contact portion or the lower contact portion of the conductive film.

2. The connector according to claim 1, wherein the base projections are formed through an etching process, a laser process, a blasting process or a matting process.

3. The connector according to claim 1, wherein the conductive film comprises an insulation film and conductive patterns formed on the insulation film, each of the conductive patterns being provided with the projections and the drainage.

4. The connector according to claim 3, wherein each of the conductive patterns is obtained by forming an original pattern having two predetermined areas corresponding to the upper contact portion and the lower contact portion, respectively, followed by exposing the predetermined areas of the original pattern to an etching process, a laser process, a blasting process or a matting process.

5. The connector according to claim 1, wherein each of the drainages is formed across a corresponding one of the upper contact portion and the lower contact portion.

6. The connector according to claim 1, wherein the conductive film comprises an insulation film and conductive patterns formed on the insulation film, each of the conductive patterns having two predetermined areas corresponding to the upper contact portion and the lower contact portion, respectively, each of the conductive patterns being provided with two sets of thin lines, the sets of the thin lines being formed on the predetermined areas, respectively, neighboring ones of the thin lines in each of the sets being separated from each other by an interval, the thin lines serving as the projections, the intervals between the thin lines serving as the drainage.

7. The connector according to claim 6, wherein the insulation film is provided with cuts, which are formed at positions corresponding to the intervals.

8. The connector according to claim 6, wherein the insulation film is provided with slits, which are formed at positions corresponding to the intervals.

9. The connector according to claim 6, wherein each of the thin line has a zigzag shape or a curved shape.

10. The connector according to claim 1, wherein the elastic member comprises a body portion and protruding portions protruding from the body portion.

* * * * *